United States Patent
Wang et al.

(10) Patent No.: US 10,026,652 B2
(45) Date of Patent: Jul. 17, 2018

(54) HORIZONTAL NANOSHEET FETS AND METHOD OF MANUFACTURING THE SAME

(71) Applicant: Samsung Electronics Co., Ltd., Suwon-si, Gyeonggi-do (KR)

(72) Inventors: Wei-E Wang, Austin, TX (US); Mark S. Rodder, Dallas, TX (US); Borna J. Obradovic, Leander, TX (US); Joon Goo Hong, Austin, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/343,157

(22) Filed: Nov. 3, 2016

(65) Prior Publication Data

US 2018/0053690 A1 Feb. 22, 2018

Related U.S. Application Data

(60) Provisional application No. 62/376,331, filed on Aug. 17, 2016.

(51) Int. Cl.
*H01L 21/8234* (2006.01)
*H01L 27/088* (2006.01)
(Continued)

(52) U.S. Cl.
CPC .. *H01L 21/82345* (2013.01); *H01L 21/02532* (2013.01); *H01L 21/02603* (2013.01); *H01L 21/28185* (2013.01); *H01L 21/823412* (2013.01); *H01L 27/088* (2013.01); *H01L 29/0673* (2013.01); *H01L 29/42392* (2013.01); *H01L 29/4966* (2013.01);
(Continued)

(58) Field of Classification Search
CPC ......... H01L 21/82345; H01L 29/66545; H01L 21/02532; H01L 29/78684; H01L 29/78651; H01L 21/823412; H01L 21/28185; H01L 21/02603; H01L 29/78696; H01L 29/4966; H01L 29/42392; H01L 29/0673; H01L 27/08
USPC ...................................................... 257/347
See application file for complete search history.

(56) References Cited

U.S. PATENT DOCUMENTS 8,319,206 B2 11/2012 Wu et al.
8,422,273 B2 4/2013 Chang et al.
(Continued)

*Primary Examiner* — Fernando L Toledo
*Assistant Examiner* — Adam S Bowen
(74) *Attorney, Agent, or Firm* — Lewis Roca Rothgerber Christie LLP

(57) ABSTRACT

Multi-Vt horizontal nanosheet devices and a method of making the same. In one embodiment, an integrated circuit includes a plurality of horizontal nanosheet devices (hNS devices) on a top surface of a substrate, the plurality of hNS devices including a first hNS device and a second hNS device spaced apart from each other horizontally. Each of the hNS devices includes a first and a second horizontal nanosheets spaced apart vertically; and a gate stack between the first and second horizontal nanosheets, the gate stack including a work function metal (WFM) layer. A thickness of the first and second horizontal nanosheets of the first hNS device is different from a thickness of the first and second horizontal nanosheets of the second hNS device, and a thickness of the WFM layer of the first hNS device is different from a thickness of the WFM layer of the second hNS device.

13 Claims, 9 Drawing Sheets

(51) Int. Cl.
    *H01L 29/06*     (2006.01)
    *H01L 29/423*     (2006.01)
    *H01L 29/49*     (2006.01)
    *H01L 29/786*     (2006.01)
    *H01L 29/66*     (2006.01)
    *H01L 21/02*     (2006.01)
    *H01L 21/28*     (2006.01)

(52) U.S. Cl.
    CPC .. *H01L 29/66545* (2013.01); *H01L 29/66742* (2013.01); *H01L 29/78651* (2013.01); *H01L 29/78684* (2013.01); *H01L 29/78696* (2013.01)

(56) References Cited

U.S. PATENT DOCUMENTS

| | | |
|---|---|---|
| 9,287,357 B2 | 3/2016 | Rodder et al. |
| 9,362,355 B1 | 6/2016 | Cheng et al. |
| 2014/0084246 A1* | 3/2014 | Pillarisetty ............ H01L 29/775 257/24 |
| 2015/0123215 A1* | 5/2015 | Obradovic ........ H01L 29/42392 257/410 |
| 2015/0262828 A1 | 9/2015 | Brand et al. |
| 2015/0364546 A1 | 12/2015 | Rodder et al. |
| 2016/0020305 A1 | 1/2016 | Obradovic et al. |
| 2016/0071729 A1 | 3/2016 | Hatcher et al. |
| 2016/0111284 A1 | 4/2016 | Kittl et al. |
| 2016/0111337 A1 | 4/2016 | Hatcher et al. |
| 2016/0163796 A1 | 6/2016 | Obradovic et al. |
| 2017/0323949 A1* | 11/2017 | Loubet .............. H01L 29/42392 |

* cited by examiner

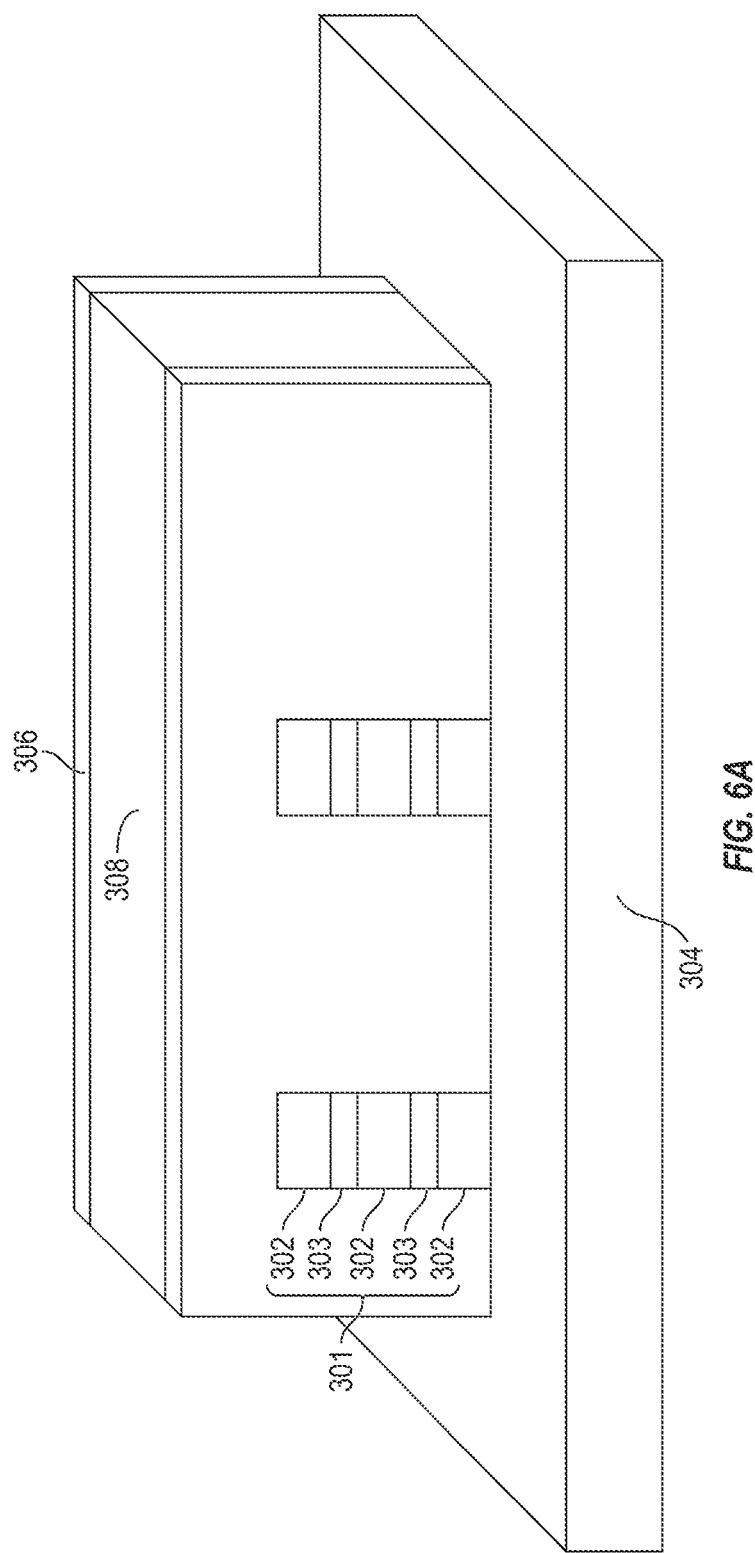

HORIZONTAL NANOSHEET FETS AND METHOD OF MANUFACTURING THE SAME

CROSS-REFERENCE TO RELATED APPLICATIONS

The present application claims priority to and the benefit of U.S. Provisional Application No. 62/376,331, filed on Aug. 17, 2016, the entire content of which is incorporated herein by reference.

General structure of nanosheet FETs and methods of manufacturing nanosheet FETs are described in U.S. patent application Ser. No. 14/722,402, which is incorporated herein by reference in its entirety.

BACKGROUND

Integrated circuits including field-effect transistors (FETs) with multiple threshold voltages (Vt) are often utilized in order to optimize the delay in switching or power leakage. As the size of integrated circuits decreases, it has become desirable to increase the density of the FETs on a substrate. Horizontal nanosheet field-effect transistor (hNS-FET) devices have been developed that include multiple horizontal nanosheets serving as conducting channel regions to enable larger effective conduction width in a small layout area overlying a substrate. There are several desired features of hNS-FET. For example, the channel thickness of an hNS-FET can be finely tuned, and two or more nanosheets can be stacked over one another at the same layout area.

It is also highly desirable to have small vertical spacing (VSP) between adjacent nanosheets in a stack of nanosheets to reduce the parasitic capacitance associated with the hNS-FET, so as to improve circuit speed. However, the VSP must be of a sufficient value to accommodate the gate stack to be formed therein. A gate stack generally includes a work function metal (WFM) that sets the threshold voltage (Vt) of the device, a high-K (HK) gate dielectric material separating the WFM from the nanosheets, and other metals that may be desired to further fine tune the effective work function (eWF) and/or to achieve a desired resistance value associated with current flow through the gate stack in the direction parallel to the plane of the nanosheets. As such, to achieve a thin VSP for reduced parasitic capacitance while being of sufficient thickness to enable different eWFs to be formed therein is a significant integration challenge.

Further, in related art integrated circuit with multiple threshold voltage (multiple Vt or mVt) devices, the desired Vt value for each of the hNS devices is achieved by utilizing different work function metals for each of the hNS devices, due to the need of different effective work functions associated with each of the multiple Vt values. As such, the deposition of the WFM for each of the hNS devices may require a separate processing step.

SUMMARY

Aspects of embodiments of the present disclosure are directed toward various embodiments of an integrated circuit including multi-Vt nanosheet devices.

In one embodiment, an integrated circuit includes a plurality of horizontal nanosheet (hNS) devices on a top surface of a substrate, the plurality of hNS devices including a first hNS device and a second hNS device spaced apart from each other in a lateral direction of the integrated circuit. Each of the hNS devices includes a plurality of horizontal nanosheets, the plurality of horizontal nanosheets including a first horizontal nanosheet and a second horizontal nanosheet spaced apart in a thickness direction of the integrated circuit; and a gate stack between the first and second horizontal nanosheets, the gate stack including a work function metal (WFM) layer. A thickness of the first and second horizontal nanosheets of the first hNS device is different from a thickness of the first and second horizontal nanosheets of the second hNS device, and a thickness of the WFM layer of the first hNS device is different from a thickness of the WFM layer of the second hNS device.

A work function metal of the WFM layer of the first hNS device may be the same as a work function metal of the WFM layer of the second hNS device.

A difference in thickness between the thickness of the WFM layer of the first hNS device and the thickness of the WFM layer of the second hNS device may match with a difference in thickness between the thickness of the first and second horizontal nanosheets of the first hNS device and the thickness of the first and second horizontal nanosheets of the second hNS device.

The gate stack may further include a gate dielectric layer surrounding the WFM layer.

The WFM layer of each of the first and second hNS devices may be a single continuous layer.

The thickness of the first and second horizontal nanosheets of the first hNS device may be thinner than the thickness of the first and second horizontal nanosheets of the second hNS device, and the thickness of the WFM layer of the first hNS device may be thicker than the thickness of the WFM layer of the second hNS device.

A threshold voltage (Vt) of the first hNS device may be different from a threshold voltage (Vt) of the second hNS device.

The plurality of hNS devices may include only nFETs, only pFETs, or both nFET(s) and pFET(s).

The first and second horizontal nanosheets of at least one of the plurality of hNS devices may include Si.

The first and second horizontal nanosheets of at least one of the plurality of hNS devices may include SiGe.

The WFM layer may include a reactive work function metal.

The reactive work function metal may be Ti, Al, Hf, Zr, La, TiAlC, or a combination thereof.

The plurality of hNS devices may be nFETs.

The WFM layer may include a mid-gap work function metal.

The mid-gap work function metal may be TiN, TaN, TiTaSiN, or a combination thereof.

The plurality of hNS devices may be pFET.

The integrated circuit may further include a third and a fourth hNS devices, wherein the threshold voltage of the first hNS device, the threshold voltage of the second hNS device, a threshold voltage of the third hNS device, and a threshold voltage of the fourth hNS device may be different from one another.

The thickness of the WFM layer of the first hNS device, the thickness of the WFM layer of the second hNS device, a thickness of the WFM layer of the third hNS device, and a thickness of the WFM layer of the fourth hNS device may be different from one another.

According to an embodiment of the present disclosure, a method of forming an integrated circuit includes: conducting selective dummy poly and sacrificial layer removal on a first stack of a plurality of stacks, each of the stacks including an alternative arrangement of sacrificial layers and horizontal nanosheets; trimming a thickness of a first and a second nanosheets of the first stack, the first and second nanosheets facing each other; depositing a sacrificial protective layer over the trimmed first and second nanosheets; conducting selective dummy poly and sacrificial layer removal on one or more of a rest of the plurality of stacks; removing the sacrificial protective layer; depositing a high-K dielectric layer; depositing a protective layer; and depositing and merging a work function metal layer. A thickness of the work function metal layer of the first stack is different from a thickness of the work function metal layer of one or more of the rest of the plurality of stacks.

The depositing of the high-K dielectric layer of the first stack and the depositing of the high-K dielectric layer of the one or more of the rest of the plurality of stacks may be conducted at a same depositing act.

The deposition of the WFM layer may be after the depositing of the high-K dielectric layer, and the deposition of the high-K dielectric layer may be after the trimming of the thickness of the first and second horizontal nanosheets of the first stack.

The depositing of the WFM layer may be conducted utilizing atomic layer deposition (ALD).

The trimming of the thickness may be through a method selected from the group consisting of diluted HF etching, SiCoNi dry etching, chemical oxide removal (COR) process, atomic layer etching, and combinations thereof.

The WFM layer of the first hNS device and the WFM layer of the one or more of the rest of the plurality of stacks may be formed at a same depositing act.

Each of the stacks may include epitaxially grown multi-stack of Si/SiGe layers with SiGe as the sacrificial layer for silicon channels.

A Ge content of the SiGe layer may be about 10% to about 90% based on a total mole amount of Si and Ge.

A crystalline orientation of SiGe as the sacrificial layer may be (110) or (111).

Each of the stacks may include epitaxially grown multi-stack of Si/SiGe layers with Si as the sacrificial layer for SiGe channels.

A Ge content of the SiGe layer may be about 10% to about 90% based on a total mole amount of Si and Ge.

A crystalline orientation of Si may be (110) or (111).

The sacrificial layers may include carbon-doped SiGe (SiGeC).

An initial thickness of the sacrificial layer of the first stack may be different from an initial thickness of the sacrificial layer of one or more stacks of the plurality of stacks.

According to an embodiment of the present disclosure, a system of forming an integrated circuit includes means for conducting selective dummy poly and sacrificial layer removal on a first stack of a plurality of stacks, each of the stacks including an alternative arrangement of sacrificial layers and horizontal nanosheets; means for trimming a thickness of a first and a second nanosheets of the first stack, the first and second nanosheets facing each other; means for depositing a sacrificial protective layer over the trimmed first and second nanosheets; means for conducting selective dummy poly and sacrificial layer removal on one or more of a rest of the plurality of stacks; means for removing the sacrificial protective layer; means for depositing a high-K dielectric layer; means for depositing a protective layer; and means for depositing and merging a work function metal (WFM) layer.

In one embodiment, each of the plurality of hNS devices may further include a third horizontal nanosheet or a third and a fourth second horizontal nanosheets stacked over the first and second horizontal nanosheets; and a gate stack between each two horizontal nanosheets adjacent each other.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

FIGS. 6a through 6h illustrate a method of forming the multi-Vt device according to an embodiment of the present disclosure.

DETAILED DESCRIPTION

Figure 1:
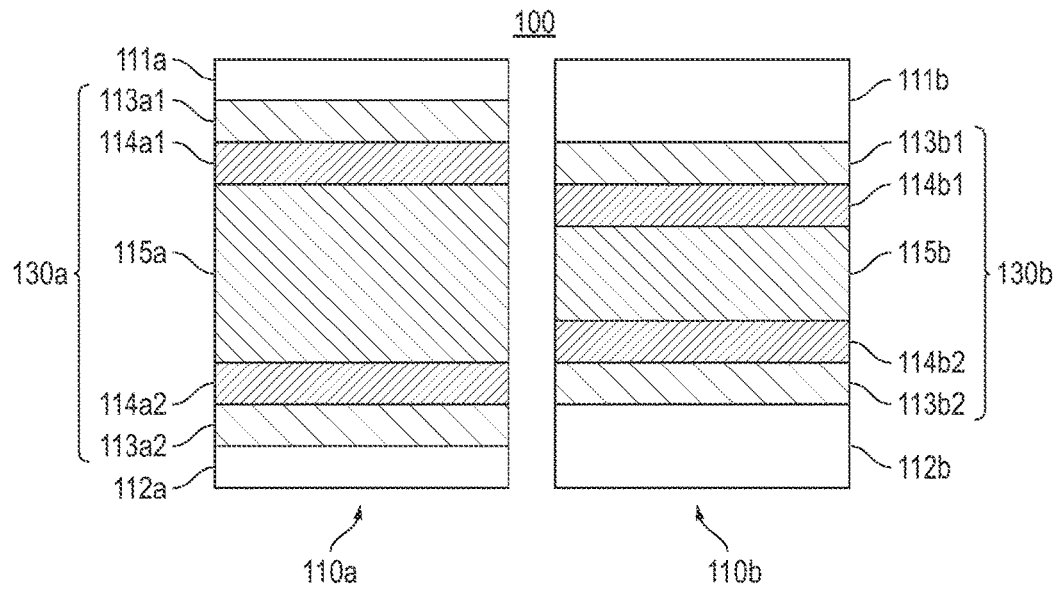
FIG. 1 is a schematic illustration of a multi-Vt device according to one embodiment of the present disclosure.

The present disclosure is directed toward various embodiments of multi-Vt horizontal nanosheet (hNS) devices and various methods of manufacturing the multi-Vt horizontal nanosheet devices.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a "gate dielectric layer" and a "HK dielectric layer" are used interchangeably. A "multi-Vt device" refers to a device that includes two or more hNS devices with two or more different threshold voltages.

With reference now to FIG. 1, a multi-Vt device 100 according to one embodiment of the present disclosure includes a first hNS device 110a and a second hNS device 110b. The first hNS device 110a includes a first horizontal nanosheet 111a and a second horizontal nanosheet 112a spaced apart vertically (i.e., spaced apart in a thickness direction of the device 100) from each other; and a gate stack 130a between the first and second horizontal nanosheets 111a and 112a. The gate stack includes a work function metal layer 115a, a first and a second high-K (HK) dielectric layers 113a1 and 113a2 separating the WFM layer 115a from the first and second nanosheets 111a and 112a, and a first and a second protective layers 114a1 and 114a2 respectively separating the WFM layer 115a from the first and second HK dielectric layers 113a1 and 113a2. Similarly, the second hNS device 110b includes a first horizontal nanosheet 111b and a second horizontal nanosheet 112b spaced apart vertically from each other; and a gate stack 130b between the first and second horizontal nanosheets 111b and 112b. The gate stack 130b includes a work function metal layer 115b, a first and a second high-K (HK) dielectric layers 113b1 and 113b2 separating the WFM layer 115b from the first and second nanosheets 111b and 112b, and a first and a second protective layers 114b1 and 114b2 separating the WFM layer 115a from the first and second HK dielectric layers 113a1 and 113a2.

Each of the first and second hNS devices 110a and 110b may further include a substrate. The first horizontal nanosheet (111a or 111b) and the second horizontal nanosheet (112a or 112b) serving as the channel for the hNS devices are stacked over one another in a vertical direction perpendicular to a top surface of the substrate, while each of these layers extends horizontally (laterally) and in parallel to the top surface of the substrate. The substrate may be an insulating substrate.

The first and second high-K (HK) dielectric layers (113a1 and 113a2, or 113b1 and 113b2), the first and second protective layers (114a1 and 114a2, or 114b1 and 114b2), and the work function metal layer (115a or 115b), may be deposited over one another in the stated order, and surround the top surface, the bottom surface and the side surfaces of a respective horizontal nanosheet, with the respective horizontal nanosheet located in the center.

When the multi-Vt device includes n-channel field-effect transistors (nFETs), the WFM layers 115a and 115b may each include one or more reactive metals (RM) for tuning the Vt by tuning the effective work function (eWF) of the nFETs. When the multi-Vt device includes p-channel field-effect transistors (pFETs), the WFM layers 115a and 115b may include one or more mid-gap metals (MM) with or without one or more reactive metals (RM) for tuning the Vt of the pFETs. The reactive metal may be any suitable reactive metal, such as Al, Hf, Ti, Zr, La, TiAlC, or any other suitable transition metal for which Vt can be modulated by a change in the thickness of the WFM layer. The mid-gap metal may be any suitable mid-gap metal, such as TaN, TiN, TiTaSiN, or any other suitable metal for which Vt can be modulated by a change in the thickness of the WFM layer. The HK dielectric layer may be formed of any suitable high-K dielectric material, such as $Al_2O_3$ and/or $HfO_2$. The protective layer may be formed of any suitable materials, such as TiN. The substrate may be formed of $SiO_2$. The first and second HK dielectric layers (113a1 and 113a2, or 113b1 and 113b2) may be formed of the same material or different materials for each of the hNS devices. The first and second protective layers (114a1 and 114a2, or 114b1 and 114b2) may be formed of the same material or different materials.

The protective layers (114a1 and 114a2 or 114b1 and 114b2) surround the reactive metal layer (115a or 115b) to reduce or prevent the reactive metal from diffusion into the HK dielectric layer (113a1 and/or 113a2, or 113b1 and/or 113b2), and to avoid undesirable oxidation of the reactive metal when exposed to air. For example, Al, as a suitable reactive metal, may diffuse into the HK dielectric layer to form Al—O dipoles at the reactive metal layer-HK dielectric layer interface, thereby resulting in a strong modulation of the effective work function, which may defeat the intended purpose of using Al to decrease the eWF. In addition, the oxidation of Al when exposed to air not only adds significant resistance but also reduces the effectiveness of Al as an nFET metal (a work function metal for an nFET).

In general, the protective layers 114a1, 114a2, 114b1 and 114b2 each need to have a sufficient thickness of at least about 0.5 nm to about 2 nm in order to provide adequate protection and encapsulation of the reactive metal layer. Further, the thickness of the WFM layers 115a and 115b need to be sufficiently thick (e.g., about 1 nm to about 5 nm) to be effective in providing the desired threshold voltage (Vt). The effective work function and thus the Vt can be modulated by varying the WFM layer thickness, e.g. varying the thickness of the WFM layer formed of the reactive metal and/or the mid-gap metal as desired.

Figure 2:
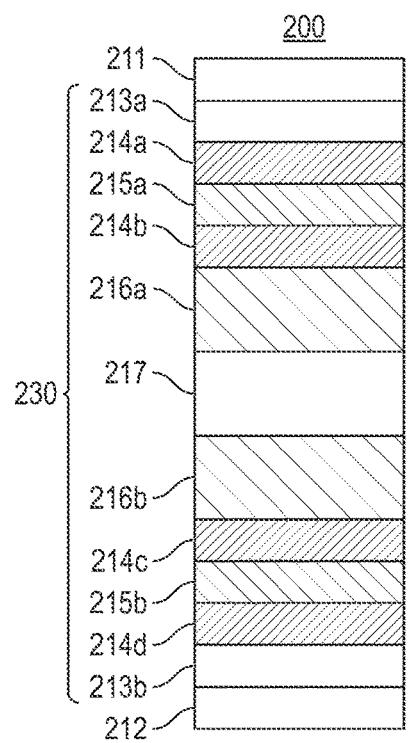
FIG. 2 is a schematic illustration of a relevant art device.

In a relevant art device as shown in FIG. 2, both reactive metal layers and mid-gap metal layers are utilized to tune the Vt of an hNS device. Referring to FIG. 2, the relevant art hNS device 200 includes a first horizontal nanosheet 211 and a second horizontal nanosheet 212 spaced apart vertically from each other; and a gate stack 230 between the first and second horizontal nanosheets 211 and 212. The gate stack 230 includes a first HK dielectric layer 213a, a first protective layer 214a, a first reactive metal layer 215a, a second protective layer 214b, a first mid-gap metal layer 216a, a contact metal layer 217, a third protective layer 214c, a second reactive metal layer 215b, a forth protective layer 214d, a second HK dielectric layer 213b and a second horizontal nanosheet 212 stacked over one another in the stated order. The hNS device may further include a substrate contacting the second horizontal nanosheet 212. The protective layer, the reactive metal, the mid-gap metal, the HK dielectric layer and the horizontal nanosheets are substantially the same as described above with reference to FIG. 1. The contact metal layer 217 connects the first and second mid-gap metal layers 216a and 216b, and may be formed of any suitable one utilized in the related art, for example, tungsten.

In device 200, the effective work function and the Vt can be adjusted and modulated by the combinational effects of the thicknesses of the reactive metal layer and thickness of the mid-gap metal layer. In forming a multi-Vt (mVt) device including a plurality of hNS devices, each having a different Vt, the desired Vt value for each of the hNS devices requires that the WFM to be different for each Vt value of the multiple Vt values due to the need of different effective work functions (eWF) associated with each of the multiple Vt values.

Here, because of the thickness of each of the protective layers 214a, 214b, 214c and 214d, the reactive metal layers 215a and 215b, the mid-gap metal layers 216a and 216b and the contact metal layer 217 has to be sufficiently thick in order to provide their respective functions effectively, the gate stack 230 requires a large vertical spacing (VSP) between the first and second horizontal nanosheets 211 and 212. For example, the VSP (the thickness between the bottom surface of the first nanosheet 211 and the top surface of the second nanosheet 212) may range from 5 nm to 15 nm.

However, as electronic devices and integrated circuitries are scaled down to make smaller devices, there is a demand that the VSP (i.e., the VSP thickness) is reduced to 10 nm or smaller, for example, 9 nm. Such a reduced VSP is not sufficient to accommodate a gate stack with the structures of gate stack 230.

Figure 3A:
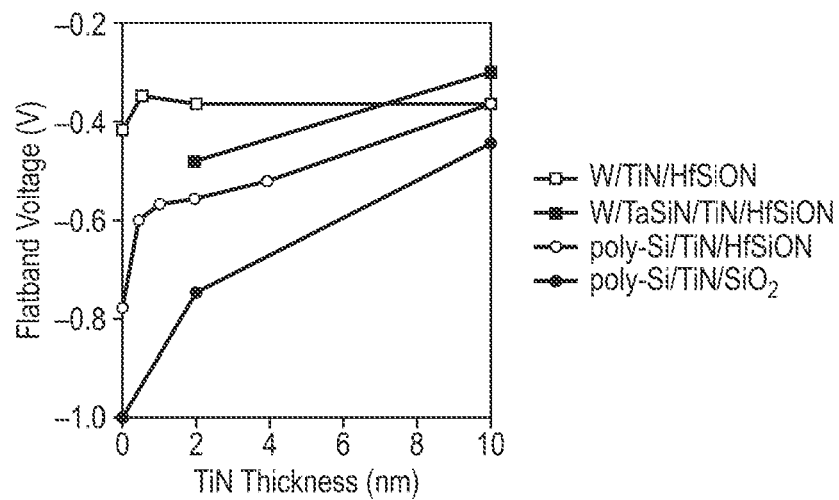
FIG. 3a and FIG. 3b are plots respectively illustrating the effect of the thickness of a mid-gap metal layer (TiN) and a reactive metal layer (TiAlC) on the effective work function (eWF) of an hNS device.
Figure 3B:
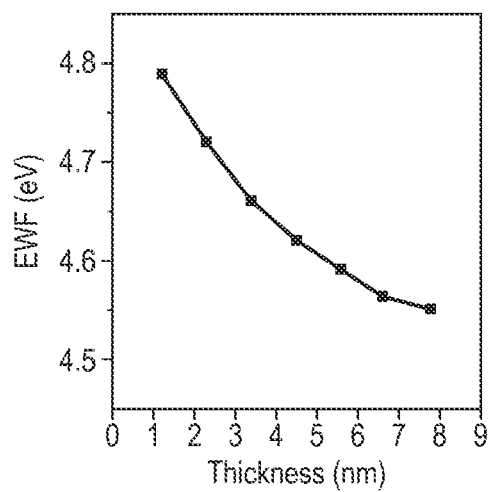

FIG. 3a and FIG. 3b are plots respectively illustrating the effect of the thickness of a mid-gap metal layer (TiN) and a reactive metal layer (TiAlC) on the effective work function of an hNS device. As can be observed in FIG. 3a, when the thickness of the mid-gap metal layer increases, the flatband voltage (an indication of the work function) increases. As can be observed in FIG. 3b, when the thickness of the reactive metal layer increases, the eWF reduces. Accordingly, the Vt values for multi-Vt devices may be adjusted by adjusting the thickness of the reactive metal layer or the mid-gap metal layer.

Referring back to FIG. 1, the thickness (e.g., the total thickness) of the first and second horizontal nanosheets 111a and 112a of the first hNS device 110a is different from the thickness (e.g., the total thickness) of the first and second horizontal nanosheets 111b and 112b of the second hNS device 110b. Also, the thickness of the WFM layer 115a of the first hNS device 110a is different from the thickness of the WFM layer 115b of the second hNS device 110b. Here, the thickness of each of the first and second horizontal nanosheets 111a and 112a of the first hNS device 110a may be the same or different from each other. Similarly, the thickness of each of the first and second horizontal nanosheets 111b and 112b of the second hNS device 110b may be the same or different from each other. In one embodiment, the thickness of the first horizontal nanosheet 111a is the same as the thickness of the second horizontal nanosheet 112a; the thickness of the first horizontal nanosheet 111b is the same as the thickness of the second horizontal nanosheet 112b, and a sum of the thickness of the first horizontal nanosheet 111a and the thickness of the second horizontal nanosheet 112a is different from a sum of the thickness of the first horizontal nanosheet 111b and the thickness of the second horizontal nanosheet 112b.

The thickness of the gate stack 130a is different from the thickness of the gate stack 130b. In more detail, the thickness of the WFM layer 115a is different from the thickness of the WFM layer 115b. Accordingly, the hNS device 110a has a Vt that is different from that of the hNS device 110b. In one embodiment, the HK dielectric layers 113a1, 113a2, 113b1 and 113b2 have the same thickness as each other, and the protective layers 114a1, 114a2, 114b1 and 114b2 have the same thickness as each other. A total thickness of the first and second nanosheets 111a and 112a, and the gate stack 130a is the same as that of the first and second nanosheets 111b and 112b, and the gate stack 130b.

In a related art device as shown in FIG. 2, the thickness of each of the reactive metal layers 215a and 215b is about 2 nm to about 5 nm. In one embodiment, the thickness of the WFM layer 115a and 115b is about 3 nm to about 6 nm.

In one embodiment, the WFM layer 115a of the first hNS device 110a and the WFM layer 115b of the second hNS device 110b include a same work function metal. In one embodiment, the WFM layer 115a and 115b of each of the first and second hNS devices 110a and 110b is a single continuous layer. That is, each of the first hNS device 110a and the second hNS device 110b includes only one WFM layer.

In one embodiment and as shown in FIG. 1, the thickness of the first and second horizontal nanosheets 111a and 112a of the first hNS device 110a is thinner than the thickness of the first and second horizontal nanosheets 111b and 112b of the second hNS device 110b. The thickness of the WFM layer 115a of the first hNS device 110a is thicker than the thickness of the WFM layer 115b of the second hNS device 110b. The total thickness of the first and second horizontal nanosheets 111a and 112a of the first hNS device 110a may be, for example, about 0.5 nm to about 2 nm thinner than the total thickness of the first and second horizontal nanosheets 111b and 112b of the second hNS device 110b. The threshold voltage of the first hNS device 110a may be, for example, about 50 mV to about 150 mV lower than that of the second hNS device. The thickness of each of the HK dielectric layer may be, for example, about 1 nm to about 3 nm thick, the thickness of each of the first and second protective layers may be, for example, about 1 nm to about 3 nm thick, the thickness of each of the reactive metal layers may be, for example, about 2 nm to about 6 nm thick, and the Vt values for the multi-Vt device may be, for example, about 50 mV to about 150 mV.

Figure 4:
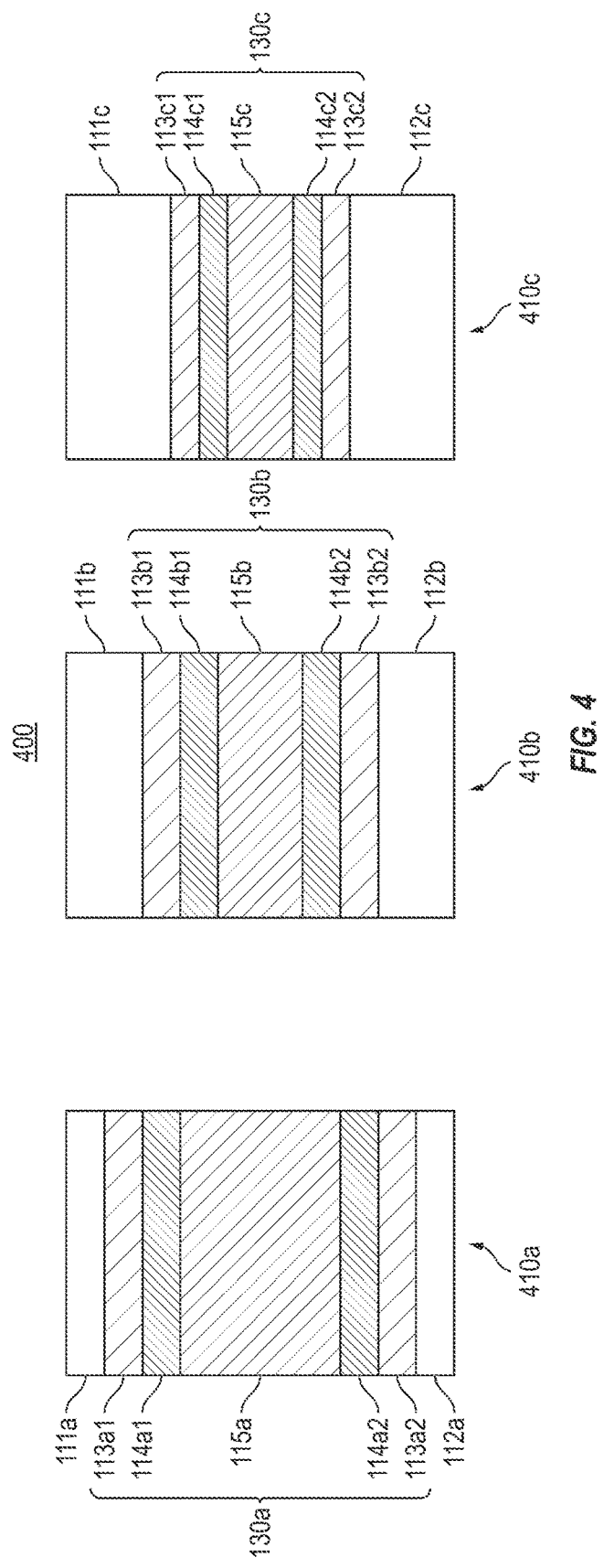
FIG. 4 shows a multi-Vt device according to an embodiment of the present disclosure.

While multi-Vt devices with two different threshold voltages have been shown in FIG. 1, embodiments of the present invention are not limited thereto. FIG. 4 shows a multi-Vt device according to an embodiment of the present disclosure. Referring to FIG. 4, a multi-Vt device 400 includes three hNS devices 410a, 410b and 410c, each with a different Vt. That is, the multi-Vt device 400 has three different threshold voltages. Here, the three hNS devices 410a, 410b and 410c each have a different total thickness of the first and second nanosheets, and a different thickness of the WFM layer.

In another embodiment, a multi-Vt device includes a first, a second, a third and a fourth hNS devices, where the threshold voltage of the first hNS device, the threshold voltage of the second hNS device, the threshold voltage of the third hNS device, and the threshold voltage of the fourth hNS device are different from one another. For example, the multi-Vt device may include a low Vt (LVt) hNS device, a super low Vt (SLVt) hNS device, and a regular Vt (RVt) hNS device. The thickness of the WFM layer of the first hNS device, the thickness of the WFM layer of the second hNS device, the thickness of the WFM layer of the third hNS device, and the thickness of the WFM layer of the fourth hNS device are different from one another. The thickness of the first and second nanosheets of the first hNS device, the thickness of the first and second nanosheets of the second hNS device, the thickness of the first and second nanosheets of the third hNS device, and the thickness of the first and second nanosheets of the fourth hNS device are different from one another. A sum of the thickness of the first nanosheet, the thickness of the second nanosheet and the thickness of the VSP between the first and second nanosheets of each of the first, second, third and fourth hNS devices may be the same as one another. That is, the distance between the top surface of the top nanosheet and the bottom surface of the bottom nanosheet is the same for each of the first, second, third and fourth hNS devices.

Figure 7:
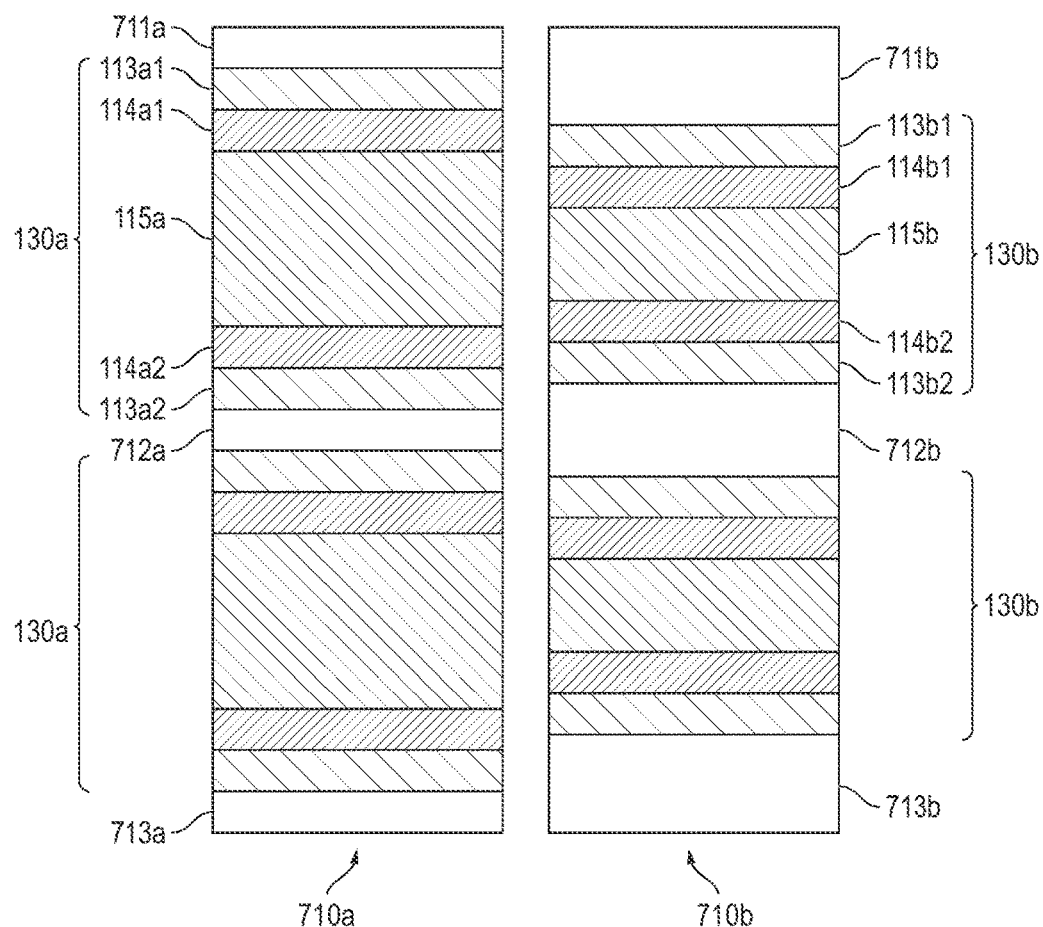
FIG. 7 is a schematic illustration of a multi-Vt device according to one embodiment of the present disclosure.

While each of the hNS devices has been shown to include a first horizontal nanosheet and a second horizontal nanosheet, embodiments of the present invention are not limited thereto. FIG. 7 shows a multi-Vt device according to an embodiment of the present disclosure. Referring to FIG. 7, a multi-Vt device 700 includes two hNS devices (710a and 710b), each with a first, a second, and a third horizontal nanosheets (711a, 712a, 713a; and 711b, 712b and 713b), with a gate stack (130a and 130b) between two adjacent nanosheets. In another embodiment, each hNS device in a multi-Vt device may include four horizontal nanosheets, or any suitable number of horizontal nanosheets with a gate stack between two adjacent nanosheets.

In one embodiment, a mutli-Vt device includes a plurality of hNS devices. The plurality of hNS devices may include one or more FETs, which may be only nFETs, only pFETs, or both nFET(s) and pFET(s). The first and second horizontal nanosheets of at least one of the plurality of hNS devices may include SiGe. In another embodiment, the first and second horizontal nanosheets of at least one of the plurality of hNS devices may include Si.

In one embodiment, the plurality of hNS devices may be nFETs and the WFM layer of each of the hNS devices may be formed of a reactive work function metal. The reactive work function metal may be Ti, Al, Hf, Zr, La, TiAlC, or a combination thereof.

In one embodiment, the plurality of hNS devices may be pFETs and the WFM layer of each of the hNS devices may be formed of a mid-gap work function metal. The mid-gap work function metal may be TiN, TaN, TiTaSiN, or a combination thereof.

Hereinafter, a method of forming a multi-Vt device according to an embodiment of the present disclosure will be described.

Figure 5:
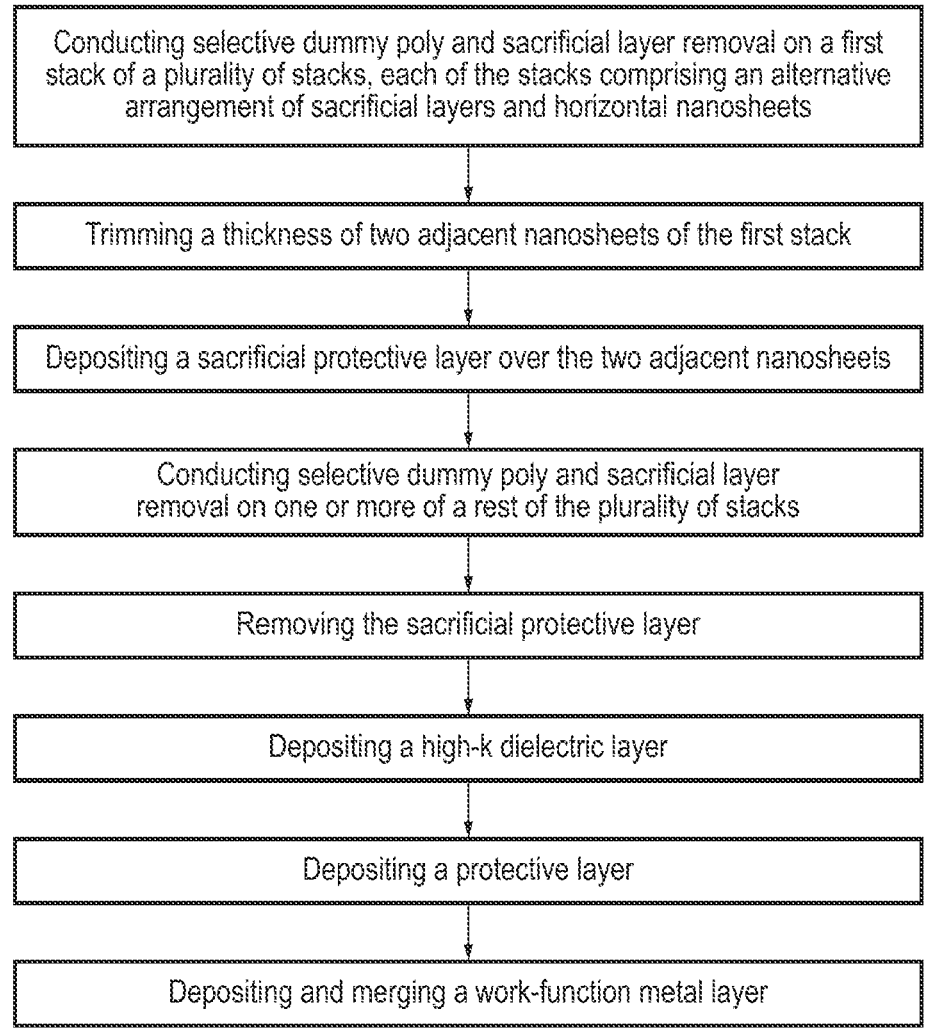
FIG. 5 is a flow chart illustrating a method of forming a multi-Vt device according to an embodiment of the present disclosure.

FIG. 5 is a flow chart illustrating a method of forming a multi-Vt device according to an embodiment of the present disclosure. Referring to FIG. 5, a method of forming the multi-Vt device includes: conducting selective dummy poly and sacrificial layer removal on a first stack of a plurality of stacks, each of the stacks including an alternative arrangement of sacrificial layers and horizontal nanosheets; trimming a thickness of two adjacent nanosheets of the first stack; depositing a sacrificial protective layer over the trimmed two nanosheets; conducting selective dummy poly and sacrificial layer removal on one or more of a rest of the plurality of stacks; removing the sacrificial protective layer; depositing a HK dielectric layer; depositing a protective layer; and depositing and merging a work function metal layer. A thickness of the work function metal layer of the first stack is different from a thickness of the work function metal layer of one or more of the rest of the plurality of stacks. The thickness of the trimmed two adjacent nanosheets of the first stack is different from a thickness of two corresponding nanosheets of one or more of the rest of the plurality of stacks.

Figure 6B:
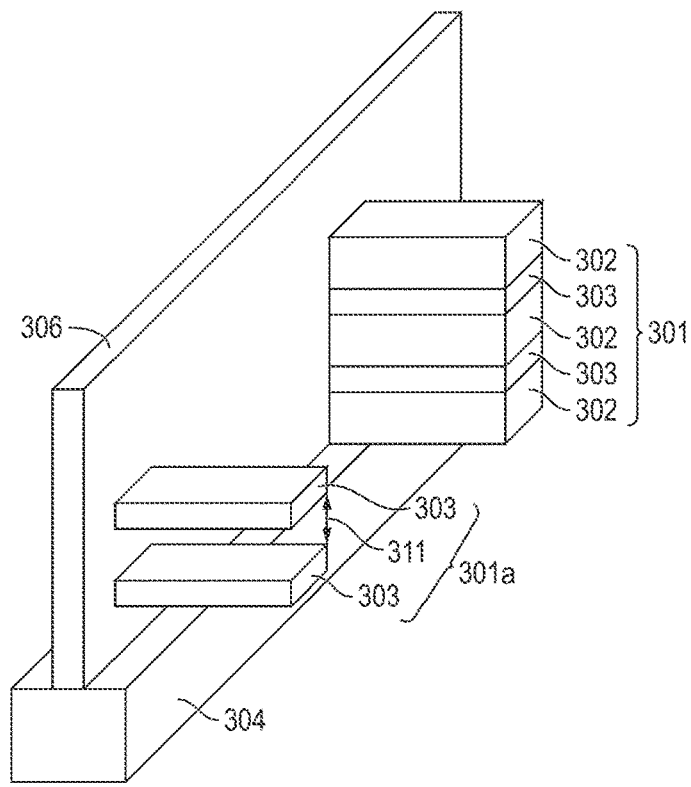

FIGS. 6a through 6h illustrate a method of forming the multi-Vt device according to an embodiment of the present disclosure. As shown in FIG. 6a, a plurality of stacks 301 are formed on a substrate 304. The stack 301 includes an alternating arrangement of sacrificial layers 302 and nanosheets 303. The thickness of the sacrificial layer 302 may be about 5 nm to about 15 nm, and the thickness of each of the nanosheets may be about 5 nm to about 15 nm. Each of the stacks may include epitaxially grown Si/SiGe layers. In one or more embodiments in which the multi-Vt device includes one or more nFETs, the nanosheets 303 may be Si and the sacrificial layers 302 may be SiGe. The Ge content of the SiGe layer may be about 10% to about 90% based on a total mole amount of Si and Ge. The Ge content may be enhanced to ensure no crystalline quality impact from threading dislocations and adequate selectivity ratio so that the sacrificial layer can be removed in the later replacement metal gate (RMG) acts. The crystalline orientation of SiGe as the sacrificial layer may be, for example, (110) or (111), other than (100). While Si and SiGe are described as suitable material for the nanosheets, embodiments of the present disclosure are not limited thereto, and any suitable nanosheet material may be utilized. For example, a III-V nanosheet may be utilized.

In one or more embodiments in which the multi-Vt device includes one or more pFETs, the nanosheets 303 may be SiGe or Ge and the sacrificial layers 302 may be Si or SiGe having a lower content of Ge than the nanosheets 303. The Ge content of the SiGe layer as the nanosheets 303 may be about 10% to about 90% based on a total mole amount of Si and Ge. The Ge content may be optimized to ensure no crystalline quality impact from threading dislocations and adequate selectivity ratio so that the sacrificial Si layer can be removed in the later RMG acts. The crystalline orientation of Si as the sacrificial layer may be, for example, (110) or (111), other than (100).

Although in the illustrated embodiment the stack 301 includes three sacrificial layers 302 and two nanosheets 303, in one or more embodiments, the stack 301 may include any other suitable number of sacrificial layers 302 and nanosheets 303 depending on the desired size of the multi-Vt device. Additionally, in one embodiment, the lowermost sacrificial layer 302 of the stack 301 may be formed on any suitable insulation substrate 304 known in the art.

Each of the stacks 301 also includes two external spacers 306 facing each other and a dummy gate 308. The external spacer 306 may be any suitable material utilized in the relevant art. The dummy gate 308 may be formed of any suitable material, such as polysilicon. During the conducting of selective dummy poly and sacrificial layer removal on a first stack 301a of a plurality of stacks 301, the sacrificial layers 302 are removed and a space 311 is formed between two adjacent nanosheets 303 (see FIG. 6b, an interior view between the spacers 306 with only one spacer 306 shown). Here, the nanosheets 303 are supported by the first and second external spacers 306 facing each other. The selective dummy poly and sacrificial layer removal may be conducted utilizing any suitable method, such as a wet etching method. When the nanosheets are formed of Si and the sacrificial layers are formed of SiGe, carboxylic acid/nitric acid/HF chemistry, and citric acid/nitric acid/HF, for example, may be utilized to selectively etch SiGe. When the nanosheets are formed of SiGe and the sacrificial layers are formed of Si, aqueous hydroxide chemistry, including ammonium hydroxide and potassium hydroxide, for example, may be utilized to selectively etch Si.

In one embodiment, the sacrificial layers may include carbon-doped SiGe (SiGeC).

In the trimming of the thickness of two adjacent nanosheets 303 of the first stack 301a, the thickness of the nanosheets 303 may be reduced by any suitable method, such as diluted hydrofluoric acid (dHF) etching, SiCoNi dry etching, chemical oxide removal (COR) process, atomic layer etching (ALEt), etc. The thickness of the nanosheets 303 may be trimmed at a controlled manner, such as one angstrom or one atomic layer at a time. For example, utilizing diluted HF at a ratio of 100 $H_2O$:1 HF, thermal oxides may be removed at a rate of 2.3 nm/min. The dry etching techniques such as SiCoNi/CORS/ALEt allow for precise control of the desired fixed native oxide thickness removal.

When SiCoNi dry etching is utilized, etchant generation in plasma is first conducted. An example reaction scheme is $NF_3$ and $NH_3$ reacts together to produce $NH_4F$ and $NH_4F \cdot HF$. Then, $SiO_2$ may be etched by the etchant at a temperature of about 30° C., where $NH_4F$ or $NH_4F \cdot HF$ reacts with $SiO_2$ to produce $(NH_4)_2SiF_6$ (solid) and $H_2O$, followed by a sublimation process at a temperature of greater than 100° C., where $(NH_4)_2SiF_6$ (solid) decomposes into $SiF_4$ (gas), $NH_3$ (gas) and HF (gas).

Figure 6C:
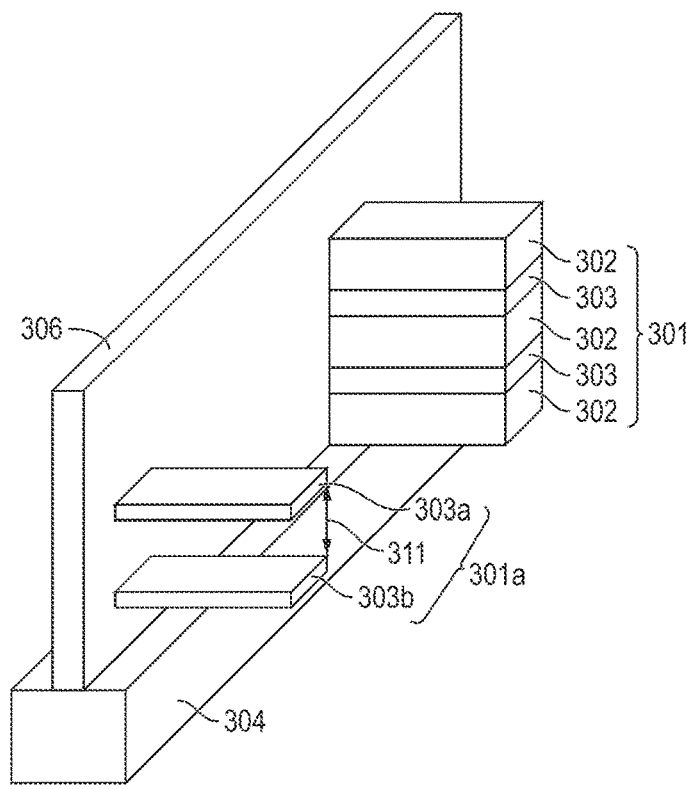

As a result, the thickness of the nanosheets 303a and 303b for the first stack 301a is thinner than the thickness of the nanosheets 303 for the second stack 301b, as shown in FIG. 6c. Here, the thickness of the nanosheet 303a may be the same as the thickness of the nanosheet 303b. However, embodiments of the present disclosure are not limited thereto, and the thickness of the nanosheet 303a may be different from the thickness of the nanosheet 303b.

Figure 6D:
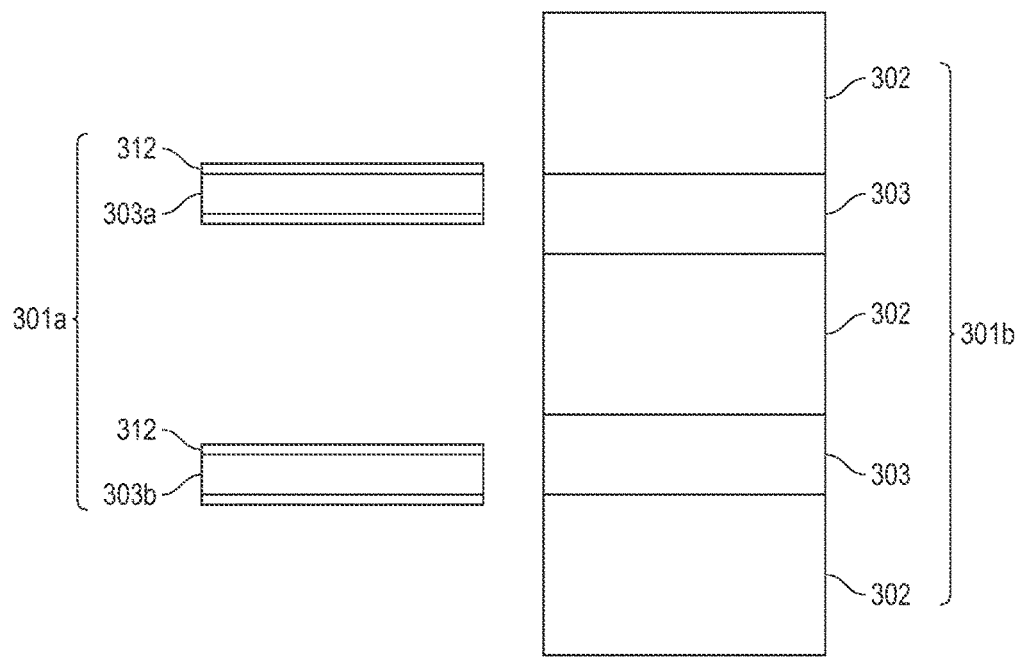
Figure 6E:
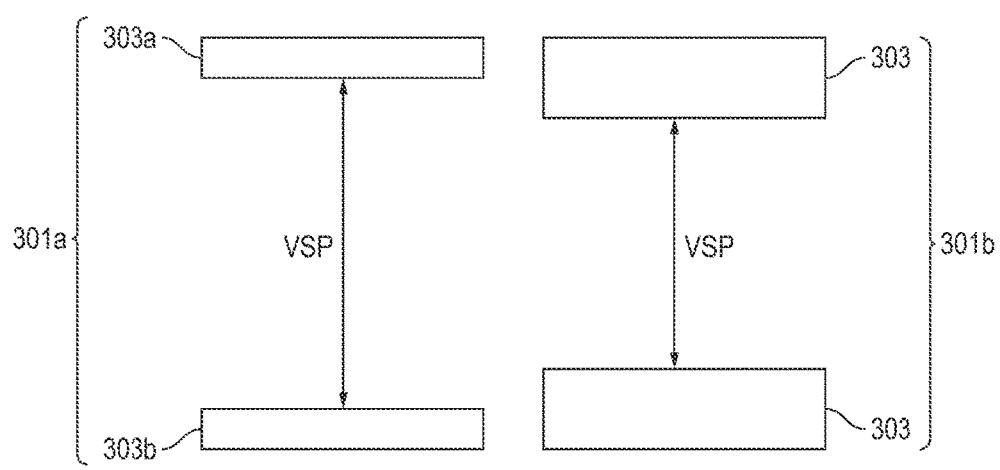

Hereinafter, for convenience of illustration, a sectional view cutting along a plane parallel to the surface of the external spacer 306 is shown. Referring to FIG. 6d, a sacrificial protective layer 312 is deposited over (e.g., to completely cover) the trimmed two adjacent nanosheets 303a and 303b of the first stack 301a. The sacrificial protective layer 312 may be formed of any suitable material, for example, a typical spin-on-glass (SOG) layer, spin-on-carbon (SOC) layer, or optical planarization layer (OPL). Then the selective dummy poly and sacrificial layer removal for the second stack 301b is conducted. The dummy poly and sacrificial layer removal may be conducted utilizing any suitable process. The sacrificial protective layer 312 is then removed. As shown in FIG. 6e, the VSP of the first stack 301a is greater than the VSP of the second stack 301b due to the trimming of the nanosheets of the first stack.

Figure 6F:
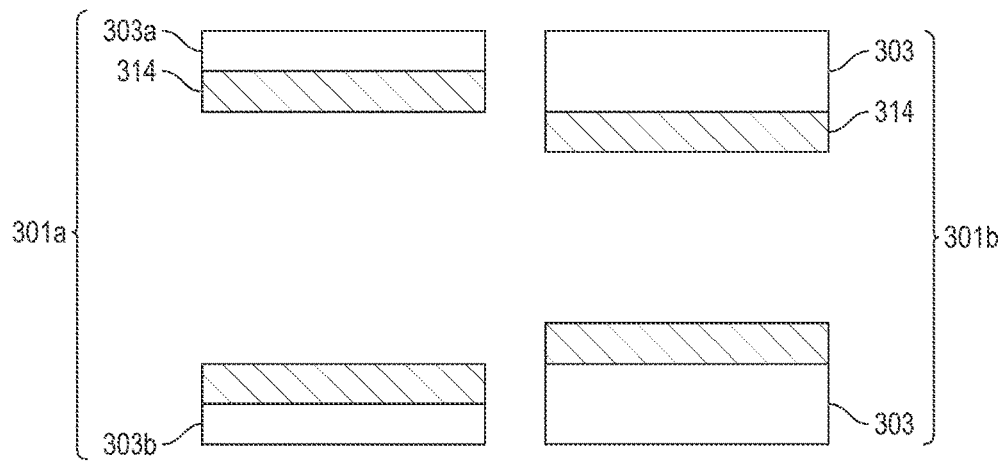

A high-k dielectric layer (also referred to as the gate dielectric layer) 314 is then deposited on both stacks 301a and 301b. That is, the gate dielectric layer 314 is deposited on both stacks 301a and 301b in the same processing act and with the same thickness. While only the HK dielectric layer 314 inside the VSP is shown in FIG. 6f, in one embodiment, the gate dielectric layer 314 may actually surround (e.g., encapsulate) each of the nanosheets by covering a top surface, a bottom surface and side surfaces of each of the nanosheets. The HK dielectric layer may be deposited utilizing any suitable method, such as atomic layer deposition (ALD). In one embodiment, the HK dielectric layer is further annealed to further improve the properties of the HK dielectric layer, such as the reliability of the HK dielectric layer. The annealing of the HK dielectric layer may be any suitable method, such as thermal annealing.

Figure 6G:
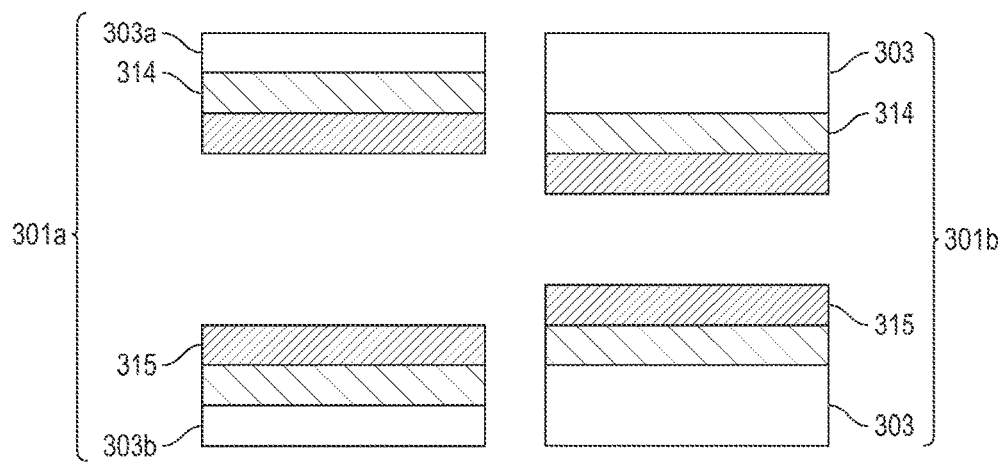

A protective layer 315 is then deposited on the HK dielectric layer as shown in FIG. 6g. The protective layer 315 may be deposited utilizing any suitable method, such as ALD. The protective layer 315 may be deposited on both stacks 301a and 301b in the same processing act and with the same thickness.

Figure 6H:
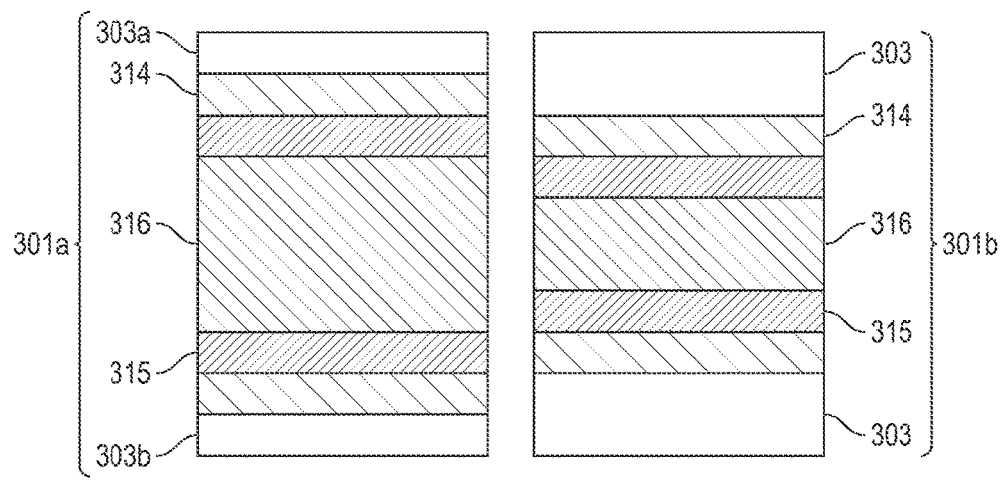

The reactive metal layer 316 is then deposited on the protective layer 315 as shown in FIG. 6h. The reactive metal layer 316 may be deposited utilizing any suitable method, such as ALD. The reactive metal layer 316 may be deposited on both stacks 301a and 301b in the same processing act. Here, the reactive metal layer 316 shown in FIG. 6h is the result of two merged sub-layers. That is, the reactive metal layer 316 includes the sub-layer that is deposited on the top surface of the protective layer 315 located on the bottom and the sub-layer that is deposited on the bottom surface of the protective layer 315 located on the top. Because the reactive metal layer 316 of the first stack 301a is thicker than the reactive metal layer 316 of the second stack 301b, the effective work function of the first stack 301a is lower than the effective work function of the second stack 301b. Therefore, the threshold voltage of the first stack 301a is different from the threshold voltage of the second stack 301b.

While a reactive metal layer is described in association with the deposition of the WFM layer, embodiments of the present disclosure are not limited thereto. In one embodiment, a mid-gap metal layer 316 is formed in place of the reactive metal layer 316 in the manufacturing of a multi-Vt pFET device.

While a method of manufacturing a two-Vt device is described herein, embodiments of the present disclosure are not limited thereto. A multi-Vt device with three threshold voltages, four threshold voltages, or any suitable number of threshold voltages may be manufactured by repeating the acts of conducting selective dummy poly and sacrificial layer removal on a selected stack of a plurality of stacks; trimming a thickness of two adjacent nanosheets of the selected stack; and depositing a sacrificial protective layer over the trimmed two nanosheets before conducting the selective dummy poly and sacrificial layer removal on one or more of a rest of the plurality of stacks. For example, in manufacturing a three-Vt device, the selective dummy poly and sacrificial layer removal may be first conducted on a first selected stack out of three stacks; the thickness of two adjacent nanosheets of the first selected stack may be trimmed to a first thickness; and a sacrificial protective layer may be deposited over the trimmed two nanosheets of the first selected stack. Then the selective dummy poly and sacrificial layer removal may be conducted on a second selected stack out of the three stacks; the thickness of two adjacent nanosheets of the second selected stack may be trimmed to a second thickness; and a sacrificial protective layer may be deposited over the trimmed two nanosheets of the second selected stack. After that, the selective dummy poly and sacrificial layer removal may be conducted on a third selected stack out of the three stacks. Then the protective layers on the trimmed nanosheets of the first and second stacks may be removed, followed by the deposition of the HK dielectric layer, the deposition of the protective layer, and the deposition of the WFM layer to the nanosheets of all three stacks.

In one embodiment, an initial thickness of the sacrificial layers 302 for the first stack 301a is different from the initial thickness of the sacrificial layers 302 for the second stack 301b. Trimming of the nanosheets of one or more of the stacks (e.g., the first stack 301a) may be additionally conducted to further adjust the difference in the VSP among the stacks.

The process may further include additional acts to complete the manufacturing of the multi-Vt device. For example, the process may further include forming a source electrode and a drain electrode with the channel region formed of the nanosheets therebetween; and removing the external spacers. The source electrode and the drain electrode may be formed utilizing any suitable method, such as epitaxial growth techniques. The external spacers may be removed utilizing any suitable method, such as chemical etching.

Although in the illustrated embodiment each of the hNS devices includes two horizontal nanosheets stacked vertically over each other, in one or more embodiments, each of the hNS devices may include any other suitable number of horizontal nanosheets, such as, for instance, three or more horizontal nanosheets stacked vertically over one another.

According to one or more embodiments of the present disclosure, a multi-Vt device may be manufactured with tight VSPs and with one single WFM deposition act. The VSP is increased locally and selectively for the designed stack by trimming the corresponding channel thickness utilizing standard semiconductor processes. The WFM layer is formed through the merging of two sublayers formed in a single ALD-reactive metal or ALD-mid-gap metal act.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims, and equivalents thereof.

What is claimed is:

1. An integrated circuit comprising a plurality of horizontal nanosheet (hNS) devices on a top surface of a substrate, the plurality of hNS devices comprising a first hNS device and a second hNS device spaced apart from each other in a lateral direction of the integrated circuit,
   wherein each of the hNS devices comprises a plurality of horizontal nanosheets spaced apart in a thickness direction of the integrated circuit, the plurality of horizontal nanosheets comprising a first horizontal nanosheet and a second horizontal nanosheet; and
   a gate stack between the first and the second horizontal nanosheets, the gate stack comprising a work function metal (WFM) layer,
   wherein a thickness of the first and second horizontal nanosheets of the first hNS device is different from a thickness of the first and second horizontal nanosheets of the second hNS device, and
   a thickness of the WFM layer of the first hNS device is different from a thickness of the WFM layer of the second hNS device.

2. The integrated circuit of claim 1, wherein each of the hNS devices further comprises a third horizontal nanosheet spaced apart from the first and second horizontal nanosheets in the thickness direction of the integrated circuit; and
   a gate stack between the second and the third horizontal nanosheets.

3. The integrated circuit of claim 1, wherein a work function metal of the WFM layer of the first hNS device is the same as a work function metal of the WFM layer of the second hNS device.

4. The integrated circuit of claim 1, wherein the thickness of the first and second horizontal nanosheets of the first hNS device is thinner than the thickness of the first and second horizontal nanosheets of the second hNS device, and
   the thickness of the WFM layer of the first hNS device is thicker than the thickness of the WFM layer of the second hNS device.

5. The integrated circuit of claim 1, wherein a threshold voltage (Vt) of the first hNS device is different from a threshold voltage (Vt) of the second hNS device.

6. The integrated circuit of claim 1, wherein the WFM layer comprises a reactive work function metal.

7. The integrated circuit of claim 6, wherein the reactive work function metal is Ti, Al, Zr, La, Hf, TiAlC, or a combination thereof.

8. The integrated circuit of claim 1, wherein the WFM layer comprises a mid-gap work function metal.

9. The integrated circuit of claim 8, wherein the mid-gap work function metal is TiN, TaN, TiTaSiN, or a combination thereof.

10. The integrated circuit of claim 9, wherein the WFM layer further comprises a reactive work function metal.

11. The integrated circuit of claim 1, further comprising a third and a fourth hNS devices, wherein a threshold voltage of the first hNS device, a threshold voltage of the second hNS device, a threshold voltage of the third hNS device, and a threshold voltage of the fourth hNS device are different from one another.

12. The integrated circuit of claim 11, wherein the thickness of the WFM layer of the first hNS device, the thickness of the WFM layer of the second hNS device, a thickness of the WFM layer of the third hNS device, and a thickness of the WFM layer of the fourth hNS device are different from one another.

13. The integrated circuit of claim 1, wherein the WFM layer of each of the first and second hNS devices is a single continuous layer.

* * * * *